(12) United States Patent
Eikenbroek

(10) Patent No.: US 7,907,016 B2
(45) Date of Patent: Mar. 15, 2011

(54) METHOD AND SYSTEM OF JITTER COMPENSATION

(75) Inventor: Johannes Wilhelmus Theodorus Eikenbroek, Emmen (NL)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 893 days.

(21) Appl. No.: 10/550,568

(22) PCT Filed: Mar. 12, 2004

(86) PCT No.: PCT/SE2004/000369

§ 371 (c)(1),
(2), (4) Date: Sep. 15, 2008

(87) PCT Pub. No.: WO2004/088846

PCT Pub. Date: Oct. 14, 2004

(65) Prior Publication Data

US 2009/0072913 A1   Mar. 19, 2009

(30) Foreign Application Priority Data

Apr. 3, 2003   (SE) ...................................... 0301005

(51) Int. Cl.
*H03L 7/00*   (2006.01)

(52) U.S. Cl. ......... 331/16; 331/34; 331/177 R; 327/156; 377/47; 377/48

(58) Field of Classification Search .................. 331/1 A, 331/16, 34, 57; 327/156; 377/47, 48
See application file for complete search history.

(56) References Cited

U.S. PATENT DOCUMENTS

| | | | |
|---|---|---|---|
| 5,642,082 A | 6/1997 | Jefferson | |
| 6,011,815 A | 1/2000 | Eriksson et al. | |
| 6,346,838 B1 * | 2/2002 | Hwang et al. | 327/156 |
| 6,515,553 B1 | 2/2003 | Filtol et al. | |

OTHER PUBLICATIONS

Swedish Patent Office, International Search Report for PCT/SE2004/000369, dated Jun. 8, 2004.

* cited by examiner

*Primary Examiner* — Arnold Kinkead
(74) *Attorney, Agent, or Firm* — Roger S. Burleigh

(57) ABSTRACT

A phase locked loop frequency synthesizer with jitter compensation having a tapped delay line for compensating the jitter prior to passing a signal subject to jitter through a nonlinearity; and, a $\Sigma\Delta$ modulator for generating, or a storing element for pre-generated storing, of a fractional pattern representing fractional weighting of a plurality of integer divisors, wherein the fractional pattern identifies one integer divisor, out of the plurality of integer divisors, at a time to be active.

30 Claims, 6 Drawing Sheets

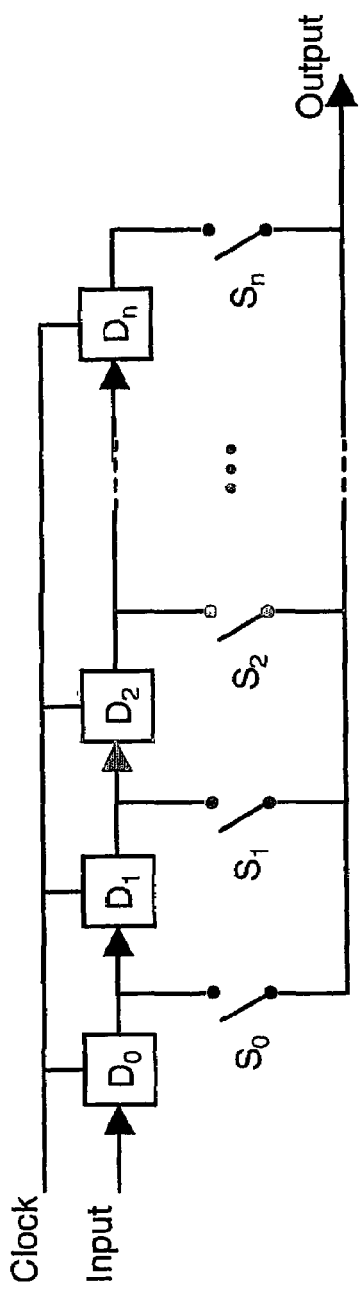
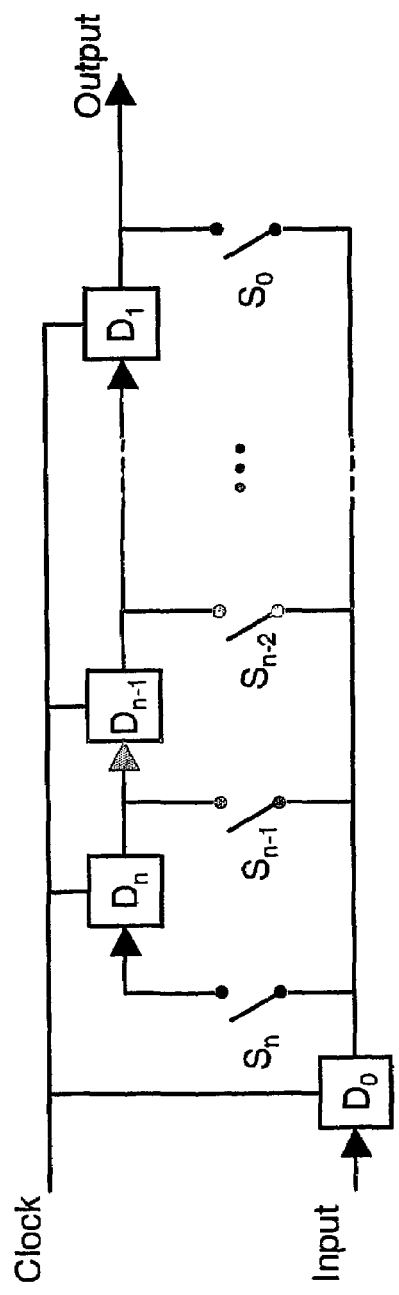

METHOD AND SYSTEM OF JITTER COMPENSATION

TECHNICAL FIELD OF THE INVENTION

The present invention relates to sigma-delta modulators, ΣΔ modulators, and phase locked loops. Especially, it relates to jitter compensation in ΣΔ-controlled fractional-N frequency synthesizers.

BACKGROUND AND DESCRIPTION OF RELATED ART

Many communications systems require stable and low noise frequency for communication. Exemplary such systems are GSM, DCS 1800 and Bluetooth. Stable frequencies, flexible to various reference oscillator frequencies, can be achieved by a fractional-N synthesizer. A fractional-N synthesizer generates frequencies between two respective nominal frequencies determined from two rationals times a reference frequency. Generally the rationals are achieved by a frequency dividing circuit altering between two integer divisors. By altering between the rationals according to a specified pattern a desired frequency can be achieved for a range of reference oscillators. A problem of altering between frequencies (division ratios) is that phase noise is introduced. The synthesized frequency will comprise a range of frequency components of the output signal being higher or lower than the desired frequency. A ΣΔ-controlled fractional synthesizer according to prior art is shown in FIG. 1.

U.K. Patent Application GB2097206 illustrates a phase locked loop type frequency synthesizer including a dual switched frequency divider. A compensation signal is generated and adaptively adjusted to reduce phase jitter. The phase jitter is due to the output pulses of the variable divider not being regularly spaced. In one embodiment the irregularities are suppressed before the signal is applied to the input of the phase comparator.

U.S. Pat. No. 5,834,987 describes frequency synthesizer systems and methods including a programmable frequency divider. The divider is controlled to divide frequency of a VCO output signal by a first or a second integral ratio. A ΣΔ modulator is responsive to a modulation input to produce the divider control input. A ripple compensation signal is provided to phase detector output.

U.S. Pat. No. 4,179,670 discloses a fractional division ratio synthesizer with jitter compensation. Jitter compensation is inserted at output of phase comparator. The compensated signal is passed through a loop filter to a voltage-controlled oscillator. A nominal division ratio of M is increased by 1 for a fraction of a number of periods at a reference frequency, $f_r$. The fraction is a ratio of $N/2^n$, where N may be increased by 1 on a cyclic basis using a ΣΔ modulator clocked at $f_r$.

U.S. Pat. No. 4,771,196 describes an electronically variable active analog delay line utilizing cascaded differential transconductance amplifiers with integrating capacitors.

U.S. Patent application US20020008557 presents a digital phase locked loop where the output of a digital controlled oscillator feeds multi-stage tapped delay lines, providing a range of clock signals at different frequencies. A control signal representing timing error in the output signal determines a tap of the tapped delay line for output.

U.S. Pat. No. 5,036,294 reveals a switched capacitor phase locked loop.

None of the cited documents above discloses a method and system for frequency synthesis providing jitter compensation prior to phase detection or posterior to oscillator signal generation of a phased locked loop, wherein jitter compensation is introduced by means of a variable delay line.

SUMMARY OF THE INVENTION

For phase locked loop frequency synthesizers, fast switching between different frequencies (as e.g. in a High-Rate extension to Bluetooth) requires large loop bandwidths. Prior art phase locked loops with large loop bandwidth generally has too much out-of-band noise in many applications. A substantial part of prior art noise originates from the frequency divider when switching between different divisors.

Consequently, it is an object of this invention to provide a method and system of jitter compensation, reducing out-of-band noise stemming from frequency division circuits.

Further, it is an object to reduce such noise/jitter, prior to the jitter being further affected by phase detector non-linearities.

It is also an object to accomplish jitter compensation by means of variable delay circuitry and delay control circuitry.

Another object is to accomplish the delay control by means of a ΣΔ modulator.

Finally, it is also an object to realize the variable delay circuitry by means of a controllable tapped delay line.

These objects are met by the invention controlling a multi-stage tapped delay line.

Preferred embodiments of the invention, by way of examples, are described with reference to the accompanying drawings below.

BRIEF DESCRIPTION OF THE DRAWINGS

FIG. 9 shows a first canonical form of variable delay realized by a tapped delay line comprising D flip-flops according to the invention.

FIG. 10 shows a second canonical form of variable delay realized by a tapped delay line comprising D flip-flops according to the invention.

DESCRIPTION OF PREFERRED EMBODIMENTS

Figure 1:
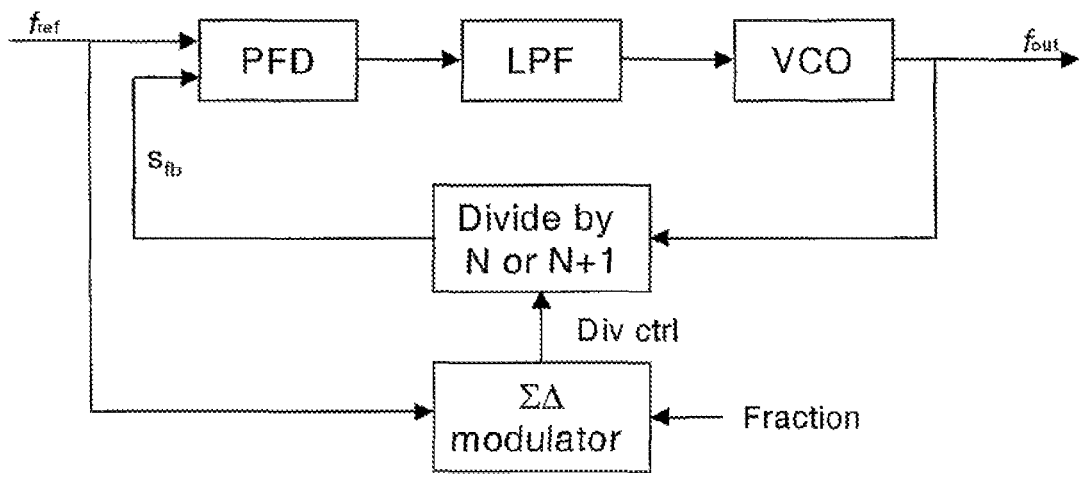
FIG. 1 illustrates a ΣΔ-controlled synthesizer according to prior art.

With reference to FIG. 1, a ΣΔ-controlled synthesizer architecture comprises a phase-frequency detector <<PFD>>, a low-pass loop filter <<LPF>>, a voltage controlled oscillator <<VCO>> and a frequency divider <<Divide by N or N+1>>. The frequency divider <<Divide by N or N+1>> is controlled by a ΣΔ modulator <<ΣΔ modulator>> clocked at frequency $f_{ref}$ with a fractional setting input <<fraction>>. The reference clock signal <<$f_{ref}$>> of frequency $f_{ref}$ is input to the phase-frequency detector to be compared with the frequencydivided output signal <<$f_{out}$>> of the voltage-controlled oscillator <<VCO>>. By modulating the frequency division factor via the ΣΔ modulator <<Div ctrl>> an average frequency division factor, $N_a$, is obtained $$N \leq N_a \leq N+1.$$

The power spectral density of the frequency division factor is small for low frequencies and increases to a maximum for frequencies around $f_{ref}/2$, with a ΣΔ modulator clocked at $f_{ref}$. High frequency components are suppressed by the low-pass loop filter <<LPF>>. However, out-of-band noise level may still be too high for many applications. This is particularly a problem for larger loop-bandwidths. Larger loop-bandwidths are e.g. necessary when fast switching between different frequencies is required, as is the case in e.g. high-rate extensions to Bluetooth.

Some prior art solutions compensate this noise by adding a compensation current at the input of the loop filter. This solution, however, encounters at least two disadvantages:

Due to non-linearities in the phase detector the phase noise will be frequency translated from higher frequencies to lower (baseband). Once in baseband it will be difficult, if not impossible, to compensate for the phase noise.

For digital implementations of the ΣΔ converters (which are more common than analog ΣΔ converters), an analog digital-analog, D/A, converter is required to convert the compensation signal to an analog current. Requiring one or more D/A converters makes manufacturing processing more complicated.

The invention solves these problems by phase-compensating a signal prior to the signal being input to the phase-frequency detector <<PFD>>.

Figure 2:
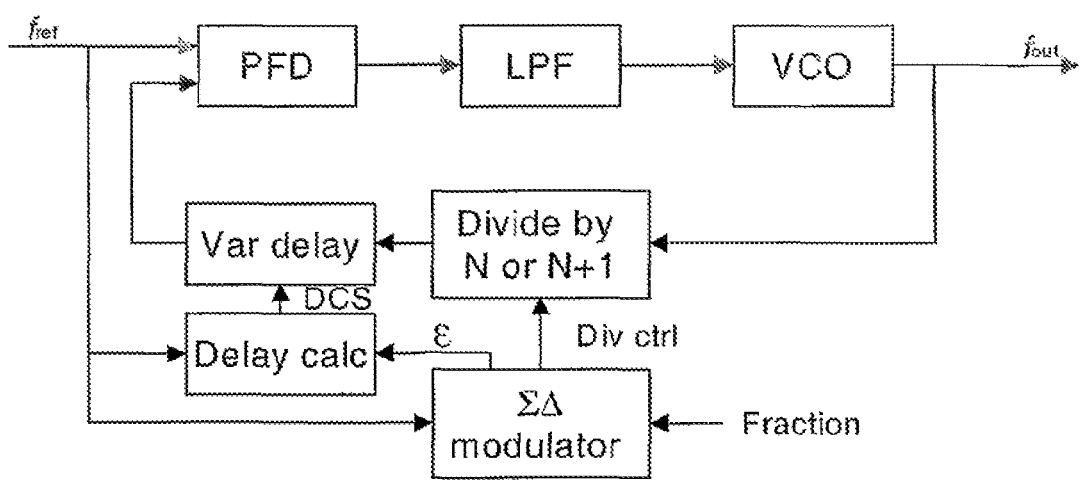
FIG. 2 shows a first embodiment of compensation of ΣΔ modulator induced jitter according to the invention.

FIG. 2 shows a first embodiment of compensation of ΣΔ modulator induced jitter according to the invention.

A variable delay element <<Var delay>> delays the input signal to the phase detector <<PFD>> in accordance with a control signal from a control element <<Delay calc>>, calculating the required jitter compensation. Preferably, also the control element is clocked at frequency $f_{ref}$. The required jitter compensation is determined from signals available from the ΣΔ modulator. The delay-control signal <<DCS>> is input to the variable delay element <<Var delay>>.

The variable delay <<Var delay>> controls the momentary phase of the signal. Preferably, the controlled quantity is the momentary zero-crossing of the signal fed to the input of the phase-frequency detector <<PFD>>. The variable delay then controls the zero crossing instances.

With no compensation, as in FIG. 1, and assuming a locked loop, the time between two zero-crossings, $T_d$, of the signal <<$S_{fb}$>> fed back to detector <<PFD>> at time $nT_{ref}$ where n is an integer and $T_{ref}=1/f_{ref}$ could be expressed as $$T_d(mT_{ref}) = N_a T_{out} + q(mT_{ref})T_{out},$$

where $T_{out}=1/f_{out}$ and $q(nT_{ref})$ is the period jitter.

The accumulated phase jitter at period n, assuming system startup at period 0, then is $$\Delta\phi(mT_{ref}) = 2\pi f_{ref} T_{out} \sum_{k=0}^{m} q(kT_{ref}).$$

Figure 3:
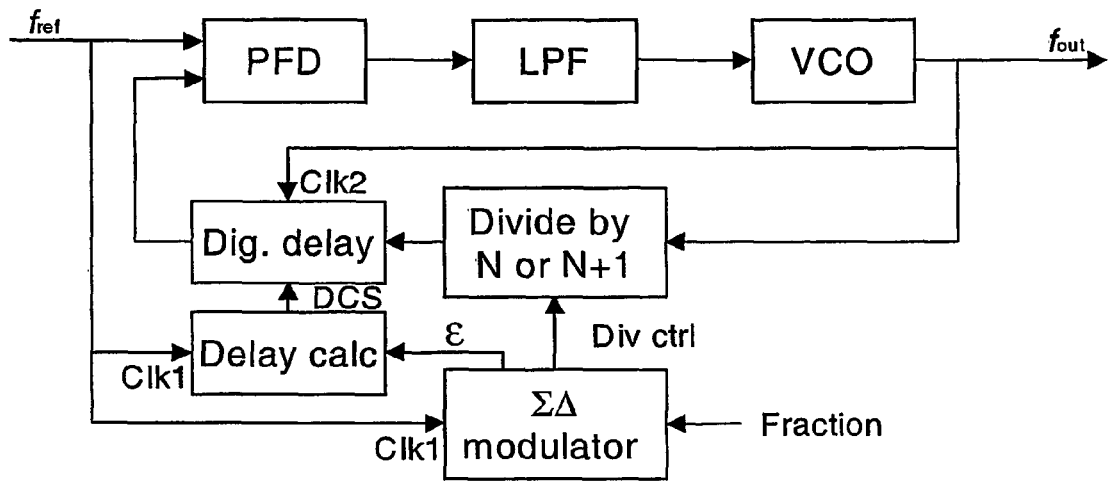
FIG. 3 shows the first embodiment of compensation of ΣΔ modulator induced jitter according to the invention with a digital variable delay.

The variable delay may be realized entirely digitally as particularly illustrated in FIG. 3, also illustrating clocking <<Clk2>> of the digital delay <<Dig Delay>>. Preferably, the digital delay is clocked by the output frequency signal <<$f_{out}$>>. Both positive and negative flanks of the output frequency signal <<$f_{out}$>> can be used to achieve a stepsize as small as $0.5\ T_{out}$, for a 50% duty cycle output frequency signal. As in FIG. 2, the control element <<Delay calc>> and the ΣΔ modulator <<ΣΔ modulator>> are preferably clocked <<Clk1>> by the reference frequency clock signal <<$f_{ref}$>>.

Figure 4:
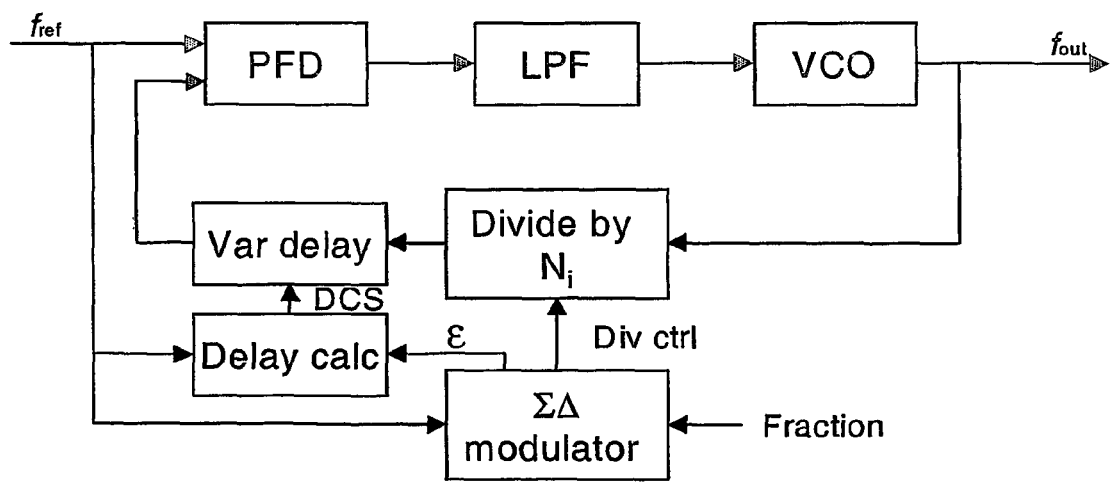
FIG. 4 shows a generalized first embodiment of compensation of ΣΔ modulator induced jitter according to the invention.

In a generalized embodiment an average division factor, $N_a$, is obtained by weighting. FIG. 4 illustrates a generalized first embodiment where a range of frequency division factors, $N_i \in \{\ldots, N-1, N, N+1, N+2, \ldots\}$, are averaged by weighting $$Na = \sum_i w_i N_i,$$

where $w_i$ are weights, such that $$\sum_i w_i = 1.$$

Similar generalization also applies to the second and third embodiments as would be obvious to the reader.

Figure 5:
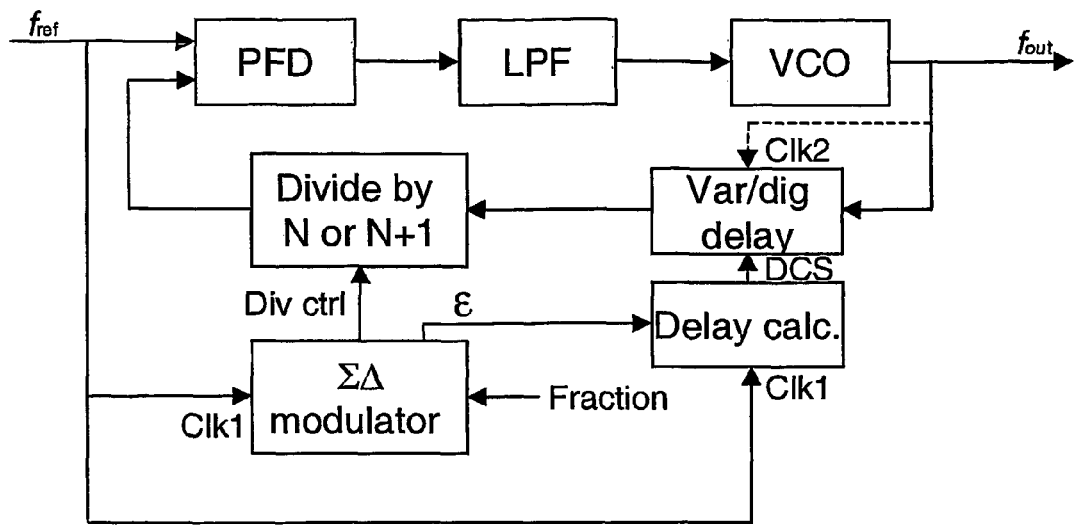
FIG. 5 shows a second embodiment of compensation of ΣΔ modulator induced jitter according to the invention.
Figure 8:
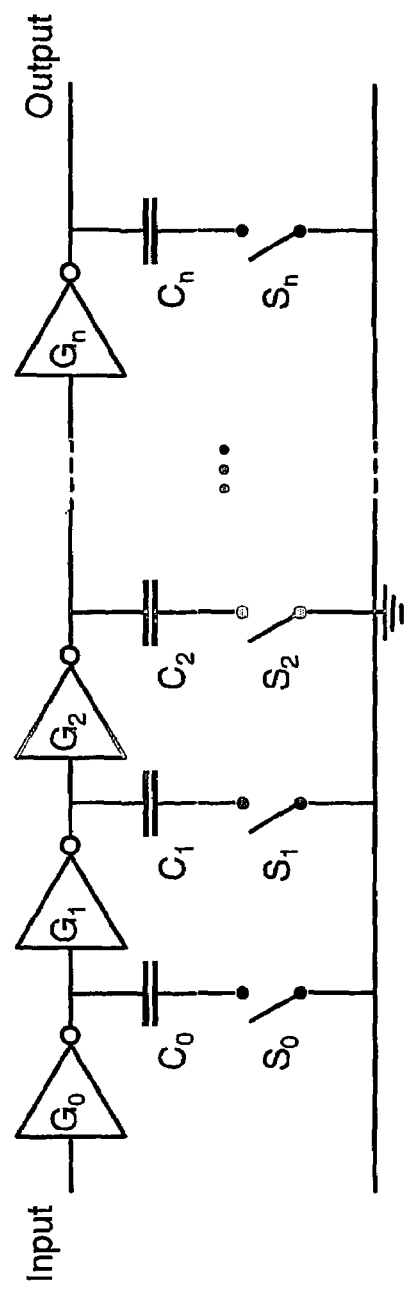
FIG. 8 shows an embodiment of variable delay realized by a tapped delay line according to the invention.

FIG. 5 shows a second embodiment of compensation of ΣΔ modulator induced jitter according to the invention. In FIG. 5 the jitter is compensated prior to the dividing element <<Divide by N or N+1>>. As compared to the preferred embodiment of FIG. 2 the frequency of the signal input to the variable delay <<Var/dig delay>> is much higher. Further, the divisor of the division element needs to be compensated for. The delay calculator and the ΣΔ modulator are clocked <<Clk1>> by the reference frequency <<$f_{ref}$>>. The variable delay <<Var/dig delay>> could be analog or digital. Preferred embodiments of analog and digital delays according to the invention are illustrated in FIGS. 8-10. For the case of digital delay, the delay elements of variable delay <<Var/dig delay>> are preferably clocked by a clock signal <<Clk2>> identical to the input signal <<$f_{out}$>>. Consequently, the clock signal could be retrieved internally of the variable delay <<Var/dig delay>> without a particular external clock signal input port. For smallest stepsize, the delay elements of a digital variable delay are preferably triggered by both positive and negative flanks of a 50% duty cycle clock signal. The clock signal <<Clk2>> is not required for an analog variable delay <<Var/dig delay>>.

Figure 6:
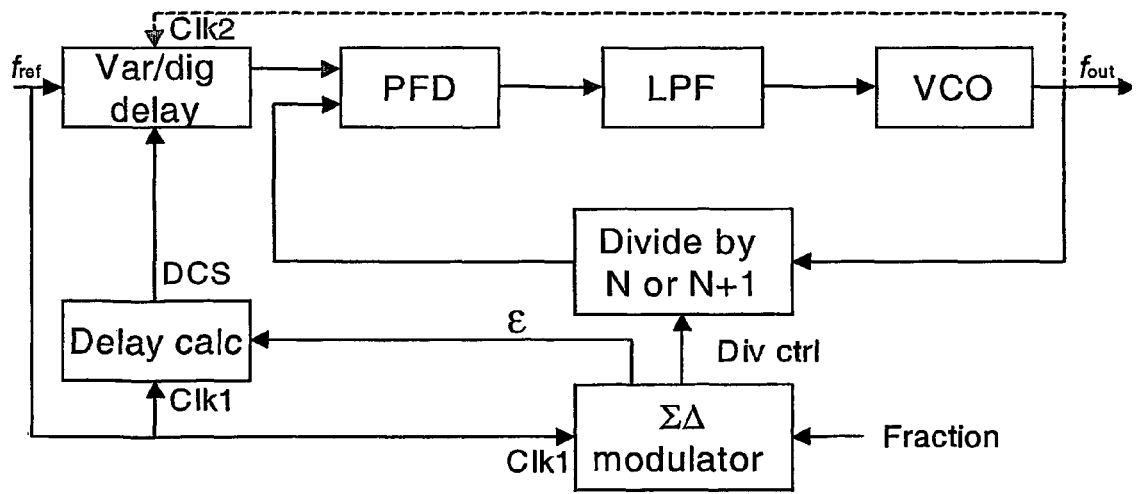
FIG. 6 shows a third embodiment of compensation of ΣΔ modulator induced jitter according to the invention.

FIG. 6 shows a third embodiment of compensation of ΣΔ modulator induced jitter according to the invention. The output signal of phase-frequency detector <<PFD>> depends on the phase difference between its two input signals. This difference is the same whether the phase of the first input is advanced or the phase of the second input is lagged. Consequently, the sign of the variable delay of element <<Var/dig delay>> is reversed as compared to the embodiment of FIG. 2. As in FIG. 5 the delay calculator <<Delay calc>> and the ΣΔ modulator are clocked <<Clk1>> by the reference frequency <<$f_{ref}$>>. The variable delay <<Var/dig delay>> could be analog or digital. For the case of digital delay, the delay elements are clocked by clock signal <<Clk2>>. Preferably, the output frequency signal <<$f_{out}$>> is used for clocking the digital variable delay as in the embodiment of FIG. 3. Both positive and negative flanks of the output frequency signal <<$f_{out}$>> can be used to achieve a stepsize as small as 0.5 $T_{out}$, for a 50% duty cycle output frequency signal. The clock signal input <<Clk2>> is not required for an analog variable delay <<Var/dig delay>>.

The embodiments of FIGS. 2-6 can be combined. The invention covers, e.g., embodiments with more than one variable delay element.

Figure 7:
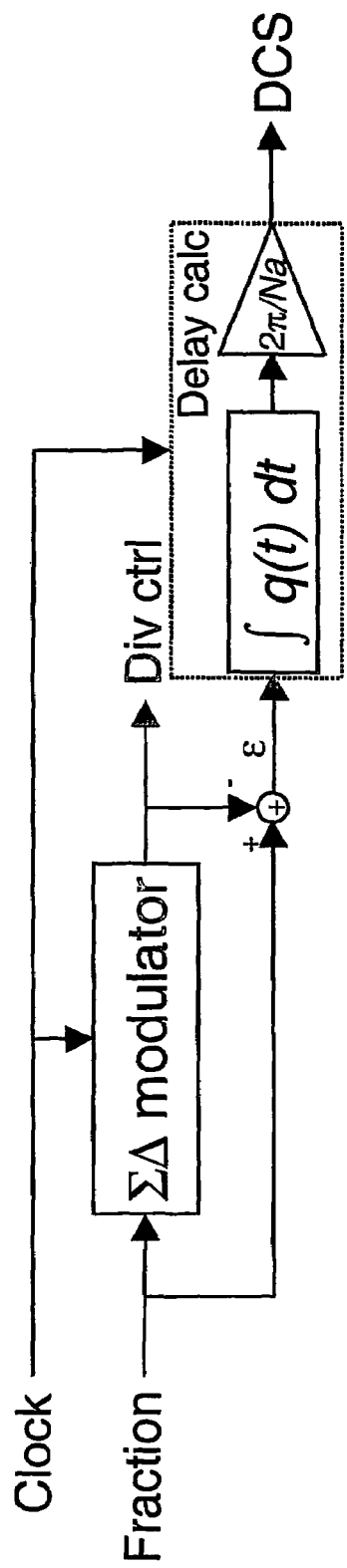
FIG. 7 shows an embodiment of delay control according to the invention.

FIG. 7 shows an embodiment of delay control according to the invention. An estimate of the accumulated phase-jitter $\Delta\phi(nT_{ref})$ is obtained by integrating an error signal <<$\epsilon$>>. The error signal is the difference between the input signal <<fraction>>, corresponding to the desired fraction $N_a$, and the output signal <<Div ctrl>> controlling the frequency dividing element <<Divide by N or N+1>>. <<Div ctrl>> is output from a $\Sigma\Delta$ modulator clocked by clock signal <<Clock>>. Phase is basically integrated frequency and the error signal <<$\epsilon$>> is integrated and scaled by $2\pi/N_a$ to obtain the estimated phase jitter in <<Delay calc>>. The variable delay and delay control signal <<DCS>> corresponds to this estimate for the embodiment of FIG. 2. Also <<Delay calc>> is clocked by clock signal Clock>>. The delay control signal of the embodiment in FIG. 5 is $N_a$ times greater, or alternatively the variable delay is scaled accordingly in delay element <<Var/dig delay>>. The delay control signal of the embodiment in FIG. 6 has a reversed sign or this sign is included in delay element <<Var/dig delay>>.

FIG. 8 shows an embodiment of an analog variable delay realized by a tapped delay line according to the invention. The tapped delay line is composed of a number of cascaded segments, each comprising an amplifier, illustrated as an inverter, with transconductance, $G_i$, a capacitor with capacitance, $C_i$, and a switch $S_i$, i$\in$[0, n], where n is the number of segments of the tapped delay line. The total delay of the tapped delay line equals the sum of delays of segments with closed switches $S_i$, where segment i with closed switch contributes with a delay proportional to $G_i/C_i$. Various transconductances $G_i$ can be obtained by varying supply voltage or bias current (depending on the transconductance circuitry).

A noisy variable delay may itself introduce more phase noise than compensated by the varying delay. For a tapped delay line as illustrated in FIG. 8, the noise level can be kept at a minimum if powered from a low-noise stabilized supply voltage and by not using more delay than necessary. Deviation from nominal values due to tolerances of manufacturing processes may also call for consideration. For most applications particular low-noise designed inverters are not required. A further advantage of the embodiment of FIG. 8 in relation to jitter compensation is that a separate multi-bit digital-analog, D/A, converter can be eliminated.

Given equal transconductances, $G_i$, for all inverters, the capacitors may represent binary values, i.e. $C_i=2^i C_0$, i>0. The switches $S_i$, 1$\geq$0, can then have their binary correspondences (1 for closed switch and 0 for an open switch) in a binary delay control signal. At least this is the case for a desired level of precision as, as explained above, the delay line generated noise increases with number of segments. However, also other alternatives of representing the delay are covered by this invention as well.

A great advantage of the embodiment of the variable delay as illustrated in FIG. 8 is that the capacitors can be implemented by gate-bulk capacitances of CMOS transistors. Thereby the variable delay can be implemented in a well known digital CMOS manufacturing process.

Figure 11:
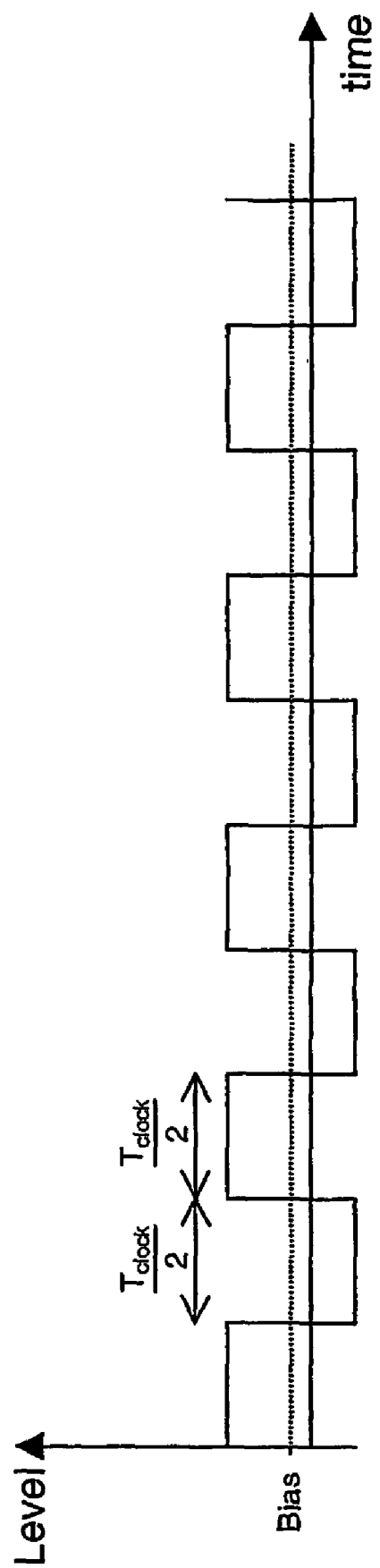
FIG. 11 illustrates a 50% duty cycle clock frequency signal according to the invention.

The tapped delay line may also be fully digital as illustrated in FIGS. 9 and 10. The figures show embodiments of variable delay realized by a tapped delay line comprising D flip-flops <<$D_0$>>, <<$D_1$>>, <<$D_2$>>, ..., <<$D_n$>>. The D flip-flop <<$D_0$>> is optional. Each D flip-flop <<$D_0$>>, ..., <<$D_n$>> is clocked by a clock signal <<Clock>>. If the flip-flops are flank-triggered on only one flank (positive or negative) each flip-flop represents a delay stepsize of $T_{clock}$, where $T_{clock}$ is the time-period of the clock signal <<Clock>>. Preferably, the flip-flops are triggered on both positive and negative flanks of a 50% duty cycle clock signal, illustrated in FIG. 11, the delay stepsize is reduced to $T_{clock}/2$. In FIG. 11, a bias level illustrates that the clock frequency signal can be NRZ (no return to zero) or RZ (return to zero). In FIGS. 9 and 10, the switches $S_i$, i=0, 1, 2, . . . n, are controlled by the delay control signal. In both FIGS. 9 and 10 only one of the switches <<$S_0$>>, <<$S_1$>>, ..., <<$S_n$>> are connected at the same time.

FIG. 9 shows a first canonical form and FIG. 10 a second canonical form of a fully digital tapped delay line.

The invention is not intended to be limited only to the embodiments described in detail above. Changes and modifications may be made without departing from the invention. It covers all modifications within the scope of the following claims.

The invention claimed is:

1. A method for jitter compensation in a phase locked loop frequency synthesizer, the method comprising the step of:
    compensating for the jitter prior to passing a signal subject to jitter through a non-linearity, said compensating comprising a variable delay realized by means of a tapped delay line;
    wherein each of a plurality of integer divisors are selected according to a fractional pattern, representing fractional weighting of the integer divisors, generated by a $\Sigma\Delta$ modulator from a fractional setting input.

2. The method according to claim 1, wherein a fraction of a first and a second integer is determined by a binary fractional pattern, for selecting the first or the second integer, generated by a $\Sigma\Delta$ modulator from a fractional setting input.

3. The method according to claim 1, wherein the tapped delay line is controlled by means of control signals derived from the $\Sigma\Delta$ modulator.

4. The method according to claim 3, wherein a control signal for controlling the tapped delay line is determined by integrating and scaling an error signal being the difference between a signal representing the fraction and a signal carrying the fractional pattern.

5. The method according to claim 1, wherein the tapped delay line comprises a plurality of capacitors with capacitances proportional to successive powers of 2.

6. The method according to claim 4, wherein the control signal carries a binary number whose bit representation connects or disconnects capacitors of the tapped delay line with respective capacitances corresponding to bit positions of the binary representation.

7. The method according to claim 1, wherein the tapped delay line comprises a plurality of serially connected delay elements.

8. The method according to claim 4, wherein the control signal carries a representation for connecting or disconnecting a delay element of the tapped delay line to either the input or output of the tapped delay line.

9. The method according to claim 8, wherein the control signal carries a bit representation for connecting or disconnecting a delay element output to the output of the tapped delay line.

10. The method according to claim 8, wherein the control signal carries a bit representation for connecting or disconnecting a delay element input to the input of the tapped delay line.

11. The method according to claim 1, wherein the non-linearity is included in or is a phase or frequency detector.

12. The method according to claim 1, wherein the output signal of the tapped delay line is input to the phase or frequency detector.

13. The method according to claim 1, wherein at least one of a reference frequency signal, a frequency divided output signal of a voltage controlled oscillator, or a frequency divided output signal of the frequency synthesizer is input to and delayed by the tapped delay line.

14. The method according to claim 1, wherein the output signal of the tapped delay line is input to frequency dividing circuitry.

15. The method according to claim 1, wherein at least one of an output signal of a voltage controlled oscillator and an output signal of the frequency synthesizer is input to and delayed by the tapped delay line.

16. A phase locked loop frequency synthesizer with jitter compensation, the frequency synthesizer comprising:
 a tapped delay line for compensating the jitter prior to passing a signal subject to jitter through a non-linearity; and
 a ΣΔ modulator for generating, or a storing element for pre-generated storing, of a fractional pattern representing fractional weighting of a plurality of integer divisors, wherein the fractional pattern identifies one integer divisor, out of the plurality of integer divisors, at a time to be active.

17. The frequency synthesizer according to claim 16, comprising a ΣΔ modulator for generating or a storing element for pre-generated storing of a binary fractional pattern for determining a fraction of a first and a second integer, the binary fractional pattern selecting the first or the second integer, the binary fractional pattern being generated from or restored from a fractional setting input.

18. The frequency synthesizer according to claim 17, comprising control means for controlling the tapped delay line by means of one or more control signals derived from the ΣΔ modulator.

19. The frequency synthesizer according to claim 18, comprising an integrator for integrating and scaling an error signal being the difference between a signal representing the fraction and a signal carrying the binary fractional pattern, the integrator output signal being a signal for controlling the tapped delay line.

20. The frequency synthesizer according to claim 16, wherein the tapped delay line comprises a plurality of capacitors with capacitances proportional to successive powers of 2.

21. The frequency synthesizer according to claim 19, comprising switches for connecting or disconnecting capacitors of the tapped delay line, wherein respective capacitances corresponding to bit positions of a binary representation of a binary number are connected or disconnected, the binary number being carried by the one or more control signals.

22. The frequency synthesizer according to claim 16, wherein the tapped delay line comprises a plurality of serially connected delay elements.

23. The frequency synthesizer according to claim 19, comprising one or more switches for connecting or disconnecting one or more delay elements to the input or output of the tapped delay line according to a bit representation, the bit representation being carried by a control signal.

24. The frequency synthesizer according to claim 23, wherein the one or more switches each connects or disconnects a delay element output to the output of the tapped delay line.

25. The frequency synthesizer according to claim 23, wherein the one or more switches each connects or disconnects a delay element input to the input of the tapped delay line.

26. The frequency synthesizer according to claim 16, wherein the non-linearity is included in or is a phase or frequency detector.

27. The frequency synthesizer according to claim 16, wherein the output signal of the tapped delay line is input to the phase or frequency detector.

28. The frequency synthesizer according to claim 16, wherein at least one of a reference frequency signal, a frequency divided output signal of a voltage controlled oscillator, and a frequency divided output signal of the frequency synthesizer is input to and delayed by the tapped delay line.

29. The frequency synthesizer according to claim 16, wherein the output signal of the tapped delay line is input to frequency dividing circuitry.

30. The frequency synthesizer according to claim 16, wherein at least one of an output signal of a voltage controlled oscillator and an output signal of the frequency synthesizer is input to and delayed by the tapped delay line.

* * * * *

UNITED STATES PATENT AND TRADEMARK OFFICE
CERTIFICATE OF CORRECTION

| | | |
|---|---|---|
| PATENT NO. | : 7,907,016 B2 | Page 1 of 1 |
| APPLICATION NO. | : 10/550568 | |
| DATED | : March 15, 2011 | |
| INVENTOR(S) | : Eikenbroek | |

It is certified that error appears in the above-identified patent and that said Letters Patent is hereby corrected as shown below:

In Column 2, Line 60, delete "OF" and insert -- OF THE --, therefor.

In Column 3, Line 5, delete "frequencydivided" and insert -- frequency divided --, therefor.

In Column 3, Line 45, delete "ZA" and insert -- $\Sigma\Delta$ --, therefor.

In Column 4, Lines 17-18, delete "Na" and insert -- $N_a$ --, therefor.

In Column 5, Line 21, delete "Clock>>." and insert -- <<Clock>>. --, therefor.

In Column 5, Line 52, delete "1≧0," and insert -- i≧0, --, therefor.

In Column 7, Line 22, in Claim 16, delete "and" and insert -- and, --, therefor.

Signed and Sealed this
Sixteenth Day of August, 2011

David J. Kappos
*Director of the United States Patent and Trademark Office*